(12) United States Patent
Brcka

(10) Patent No.: US 7,771,562 B2
(45) Date of Patent: Aug. 10, 2010

(54) ETCH SYSTEM WITH INTEGRATED INDUCTIVE COUPLING

(75) Inventor: Jozef Brcka, Loundonville, NY (US)

(73) Assignee: Tokyo Electron Limited, Tokyo (JP)

( * ) Notice: Subject to any disclaimer, the term of this patent is extended or adjusted under 35 U.S.C. 154(b) by 636 days.

(21) Appl. No.: 11/563,399

(22) Filed: Nov. 27, 2006

(65) Prior Publication Data

US 2007/0113981 A1 May 24, 2007

Related U.S. Application Data

(63) Continuation-in-part of application No. 10/716,729, filed on Nov. 19, 2003, now Pat. No. 7,426,900.

(51) Int. Cl.
C23C 16/00 (2006.01)
C23F 1/00 (2006.01)
H01L 21/306 (2006.01)
H05B 31/26 (2006.01)

(52) U.S. Cl. ............... 156/345.48; 118/723 E; 118/723 ER; 118/723 I; 118/723 IR; 156/345.43; 156/345.44; 156/345.45; 156/345.47; 156/345.49; 315/111.21; 315/111.51; 315/111.71

(58) Field of Classification Search ............ 156/345.43, 156/345.44, 345.47, 345.48
See application file for complete search history.

(56) References Cited

U.S. PATENT DOCUMENTS

| | | | |
|---|---|---|---|
| 5,513,765 A | 5/1996 | Usui | |
| 5,685,941 A * | 11/1997 | Forster et al. | 156/345.48 |
| 5,688,358 A | 11/1997 | Tanaka et al. | |
| 6,020,686 A * | 2/2000 | Ye et al. | 315/111.51 |
| 6,027,601 A | 2/2000 | Hanawa | |
| 6,042,686 A | 3/2000 | Dible et al. | |
| 6,188,564 B1 | 2/2001 | Hao | |
| 6,210,539 B1 | 4/2001 | Tanaka et al. | |
| 6,353,206 B1 | 3/2002 | Roderick | |
| 6,440,260 B1 | 8/2002 | Denda et al. | |
| 6,459,066 B1 | 10/2002 | Khater et al. | |
| 6,471,830 B1 | 10/2002 | Moslehi et al. | |
| 6,756,737 B2 * | 6/2004 | Doi et al. | 315/111.51 |
| 6,825,618 B2 | 11/2004 | Pu et al. | |
| 2001/0009139 A1 | 7/2001 | Shan et al. | |
| 2002/0027205 A1 | 3/2002 | Liu et al. | |
| 2002/0101167 A1 | 8/2002 | Shan et al. | |
| 2005/0103444 A1 | 5/2005 | Brcka | |
| 2005/0103445 A1 | 5/2005 | Brcka et al. | |

* cited by examiner

Primary Examiner—Parviz Hassanzadeh
Assistant Examiner—Rakesh Dhingra
(74) Attorney, Agent, or Firm—Wood, Herron & Evans, L.L.P.

(57) ABSTRACT

An integrated capacitively-coupled and inductively-coupled device is provided for plasma etching that may be used as a primary or secondary source for generating a plasma to etch substrates. The device is practical for processing advanced semiconductor devices and integrated circuits that require uniform and dense plasma. The invention may be embodied in an apparatus that contains a substrate support, typically including an electrostatic chuck, that controls ion energy by capacitively coupling RF power to the plasma and generating voltage bias on the wafer relative to the plasma potential. An etching electrode is provided opposite the substrate support. An integrated inductive coupling element is provided at the perimeter of the etching electrode that increases plasma density at the perimeter of the wafer, compensating for the radial loss of charged particles toward chamber walls, to produce uniform plasma density above the processed wafer. The device has a capacitive coupling zone in its center for energizing etching ions and an inductive coupling zone at its perimeter of the wafer. Both zones together with plasma create a resonant circuit with the plasma.

12 Claims, 10 Drawing Sheets

ETCH SYSTEM WITH INTEGRATED INDUCTIVE COUPLING

This application is a Continuation-in-Part of U.S. patent application Ser. No. 10/716,729, filed Nov. 19, 2003, hereby expressly incorporated herein by reference herein.

FIELD OF THE INVENTION

This invention relates to high density plasma generating devices, systems and processes, particularly for the manufacture of semiconductor wafers and integrated circuits. This invention particularly relates to the high density inductively coupled plasma (ICP) and capacitively coupled plasma (CCP) sources used in semiconductor and integrated circuit processing.

BACKGROUND OF THE INVENTION

There are two principal groups of the plasma sources: capacitively-coupled plasma sources, which utilize RF electric field coupling to the plasma, and inductively coupled plasma (ICP) sources, which utilize RF magnetic field coupling to the plasma.

Capacitively-coupled plasma sources include "planar diode" or "parallel plate" systems, in which a surface to be etched is placed on one electrode that is coupled to an RF generator through a blocking capacitor, which does not allow real current to flow from the electrode to the RF generator. This forces the plasma to find a condition in which the electron current reaching the electrode from the plasma exactly balances the ion current averaged over one RF cycle. Since electrons are more mobile than ions, the electrode acquires a negative potential to limit the electron current and encourage the positive ion current. This negative potential is called the self-biased voltage, which results in an energetic ion bombardment of the surface being etched. Changing applied RF power can control the ion bombardment. A planar triode capacitively-coupled plasma system with two RF electrodes and grounded walls represents another geometry.

Capacitively-coupled sources have widespread use in semiconductor plasma processing, but have some problems and limitations. For instance, the electrical behavior of a capacitively-coupled discharge is influenced by the reactor geometry, where plasma potential depends strongly on the area of the powered electrode relative to the area of all other surfaces in contact with the discharge. In symmetrical systems, both electrodes can be subjected to high-energy ion bombardment, including energetic ion bombardment of walls and fixtures causing sputtering of these surfaces and chamber contamination. The pressures typically used have to be maintained high enough (>100 mTorr) so that sputtering of the grounded surfaces is not a problem. In asymmetric low pressure systems, only the biased electrode is sputtered, as the walls are exposed to low energy ions, and a nonuniform plasma density that peaks in the center is produced. Nonuniform plasma caused by large losses of electrons and ions to the chamber walls causes nonuniform etch rates to result. Optimal geometry at low pressure has been cylindrical geometry, including that in hexode systems, which is not adaptable to 300 mm single wafer semiconductor manufacturing.

A common drawback of the above-described systems is an inability to independently control ion energy and ion flux at a fixed pressure and RF frequency. Planar triode systems solve this problem but require relatively high pressure to eliminate sputtering of the top electrode, which voltage can be reduced by increasing frequency at the top electrode and decreasing frequency at the wafer electrode. In the VHF frequency range, high plasma densities can be generated with low applied voltages. Higher frequencies result in less damage, more uniformity across the electrode, and the ability to process larger substrate areas at more uniform rates. For example, recent developments in capacitively coupled plasma systems step in the direction of higher excitation frequencies in the 30 to 300 MHz range, where high plasma densities can be generated with low applied voltages. This produces a lower damage process with improved uniformity across the electrode, so that larger areas may be processed at more uniform rates.

Inductively coupled plasma (ICP) sources provide relatively low ion energy bombardment and reasonable etch rates. Common ICP sources include coils having planar, cylindrical or dome-shaped geometries. The so-called helical resonator is a cylindrical ICP source in which a movable tap on the coil is used to optimize tuning and power transfer into the plasma. The helicon source is an ICP source that uses an antenna with specific geometry to launch a wave along an externally applied magnetic field, which can couple energy into the plasma electrons. High frequency (2.45 GHz) electromagnetic radiation is also used to generate high-density plasma in the microwave range but excitation is limited to <$10^{11}$ electrons per $cm^3$, so it is mostly used as downstream plasma for wafer processing. In combination with large magnetic fields (875 Gauss for excitation at 2.45 GHz) an electron cyclotron resonance (ECR) can be achieved with which plasma densities in the $10^{13}$ $cm^{-3}$ range. There are many commercially available plasma sources that can be used to generate high-density plasmas (>$10^{11}$ electrons $cm^{-3}$) at relatively low pressures (<10 mTorr) without requiring the application of high voltages.

Plasma sources are used in combination with a capacitively-coupled, RF-powered electrode on which the processed wafer is placed. Such an electrode is often an electrostatic chuck (ESC), which consists of a base plate having cooling channels or heating structure inside and connections for backside gas, DC chucking electrodes, and temperature detectors, etc. In some cases a flexible bellows mounted between a robust backside flange and a bottom chamber flange allows vertical movement of the ESC to enhance process control variables.

In systems with independently RF biased substrate holders, independent control of the ion energy and ion flux can be obtained. Typically, the power used in the high-density plasma source is much larger than the bias power applied to the wafer-bearing electrode. Increasing the bias power increases the ion energy without changing the ion current density. Increasing the source power results in both an increase in the ion flux and a decrease in the ion energy.

Etch uniformity at the wafer is affected by ion flux and ion energy. Generally, the ion flux towards the wafer is a function of plasma density distribution. To achieve uniform etching, uniformly distributed plasma parameters have to be provided. Typically, the TCP sources with spiral coils produce a plasma distribution with a peak at its center at the pressures that are typically used. Multiple coil configurations, magnetic fields, wafer pedestal size and material, and additional chamber hardware are used to improve plasma density distribution. For instance, multipolar magnetic field confinement of a plasma helps to increase plasma density and improve plasma homogeneity, but only for pressures well below 1 milliTorr (mTorr). From these pressures, plasma homogeneity degrades rapidly as the pressure is increased. Another solution has been to provide a magnetic confinement ring around an electrostatic chuck to confine the plasma within the area defined by the ring. Unfortunately, the magnetic confinement ring often produces the well-known cusp effect on the peripheral surface of the wafer due to the magnetic field of the confinement ring.

In ICP systems, the use of dual coils or dual zone coil configurations within an ICP source can partially improve the plasma density distribution. However, because of the distance of the coil from the wafer pedestal, increased RF power is required to compensate radial power loss, for which an additional RF generator and matching unit are typically needed. Still, the sidewall effect is not completely removed from the wafer. Significant chamber modifications may be required. A larger size dielectric windows may be needed, and the window thick enough to withstand atmospheric forces. Additional controlling units and cooling may be required. For current 300 mm size wafers, all these components represent large and expensive consumable parts, increased complexity, resulting in high cost of operation and significantly high overall cost of the machine.

Furthermore, producing uniformly distributed plasma over a wafer may have the undesirable effect of reducing plasma density. A wafer exposed to the reduced plasma density generally takes more time to produce a desired etch or deposition than a wafer subject to a higher plasma density. Hence, the etch or deposition process may take longer to complete in a uniformly distributed plasma environment.

Accordingly, there is a need for an ICP source that produces a high density uniform plasma that is simple and low in cost.

SUMMARY OF THE INVENTION

An objective of the present invention is to provide a plasma source for utilization in a plasma process, such as plasma etching, plasma deposition or plasma cleaning, that is uniform across the surface of the substrate being processed. Another objective of the invention is to provide a compact plasma source that can be used either as primary plasma source or as complimentary source to a primary ICP source. A further objective of the invention is to provide a highly effective plasma source for a simplified reduced cost chamber.

According to principles of the present invention, a compact, integrated CCP and ICP plasma source is provided. In certain embodiments, an electrostatic, inductively-coupled wafer support (i-ESIC) is provided in the vacuum chamber of a plasma processing apparatus. The i-ESIC wafer support has two integrated portions, including a central wafer support surface that is capacitively coupling to the plasma, and an inductive ionization source that is connected to the central surface and provides inductively-coupled RE energy to the plasma.

In certain illustrated embodiments, the capacitively-coupled central wafer support surface is an electrostatic chuck (ESC), which holds a wafer during processing. The chuck is preferably biased to a negative potential relative to the plasma to control the energy of ions from the plasma onto the supported substrate. The inductively-coupled component is preferably annular and surrounds the central portion, coupling energy to the plasma through RF magnetic fields generated by an inductive element therein.

In one embodiment, the central substrate support surface and the annular inductive element are coupled in series between the chamber ground and an RF generator through a matching network. For example, the central support may be capacitively-coupled to the matching network and capacitively-coupled to the inductive element, which, in turn, may be capacitively-coupled to ground. The impedances of the series circuit may be designed in conjunction with those of the matching network to produce a single resonant circuit. Alternative configurations are described below.

According to certain principles of the present invention, the integrated wafer chuck and active peripheral ionization source is provided. With the source, plasma is generated in the vicinity of the wafer where it will affect immediately the plasma distribution above the wafer. Because of the close proximity of the source to the wafer, the source does not require a large RF power supply. The source may be used as a secondary or complementary source with which plasma is generated that compensates for non-uniformity generated by a primary ICP source. The source of the present invention generates a higher density plasma that diffuses into a low-density capacitively-coupled plasma above the wafer. With the present invention, RF hardware can be reduced in size and power. The source may be used as a single integrated plasma source sufficient to process wafers placed on the pedestal, which may be, for example, an electrostatic chuck (ESC).

An alternative embodiment of the invention includes a substrate support that provides control of ion energy due to capacitive coupling of RF power to the plasma and a voltage bias on the wafer with respect to the plasma potential. An upper electrode is also provided that is RF-biased, and may be biased with a different RF frequency, typically higher, than the substrate support, and which provides enhanced plasma production. In this embodiment, the upper electrode includes an integrated inductively coupled element at its perimeter that provides increased plasma density at the perimeter of the upper electrode. When the electrode distance from the substrate support is comparable to the diameter of the wafer, the upper electrode compensates for radial loss of charged particles towards the chamber walls and thus improves plasma density uniformity in the vicinity of the processed wafer. The integrated CCP and ICP upper electrode can be used in combination with an ESC wafer support, or with an integrated-ESIC device described in the embodiments above.

An integrated-ESIC device, an integrated upper electrode device or a combination of both, can operate simultaneously in two modes. By capacitively coupling at the center of the integrated device and by inductive coupling at the perimeter of the device.

Preferably, both the CCP and ICP components of the device are adjusted to create resonant circuit in combination with plasma itself.

The present invention is based, in part, on the principles that etch uniformity at a wafer is affected by plasma density distribution and by ion energy, and that to achieve uniform etching, uniformly distributed plasma parameters should be provided. It has been found that it is not sufficient to reduce the loss to the walls only in a passive way, and that the most effective way to reduce loss to the walls is to generate an active plasma in the depleted region around the wafer. Plasma density above the wafer is most easily affected by plasma generation in the vicinity of the wafer. This is done by using ICP, which leads to high-density plasma generation. This approach does not require oversized RF power supplies. The present invention utilizes existing RF generators to bias a wafer pedestal. A center-peaked plasma distribution that is generated by the remote primary ICP source may be compensated for at the wafer edge by peripheral plasma generation from a secondary high-density plasma source according to the present invention.

Advantages of the integrated CCP and ICP device in combination with an ESC include high density-plasma production at perimeter of the wafer, compensation of non-uniformity in plasma density that is usually in the form of a peak at the center of the chamber, uniform plasma processing at the wafer. The advantages also include a compact integrated device that provides simultaneous and independent ion energy and ion flux control, combined capacitive aid inductive coupling in one device, and a device that is suitable for etching, deposition, sputtering and cleaning technology. The source of the present invention eliminates the need for large and robust dielectric windows while increasing dielectric window lifetime and reducing window failure and window cleaning.

These and other objectives and advantages of the present invention will be more readily apparent from the following detailed description.

DETAILED DESCRIPTION

Figure 1:
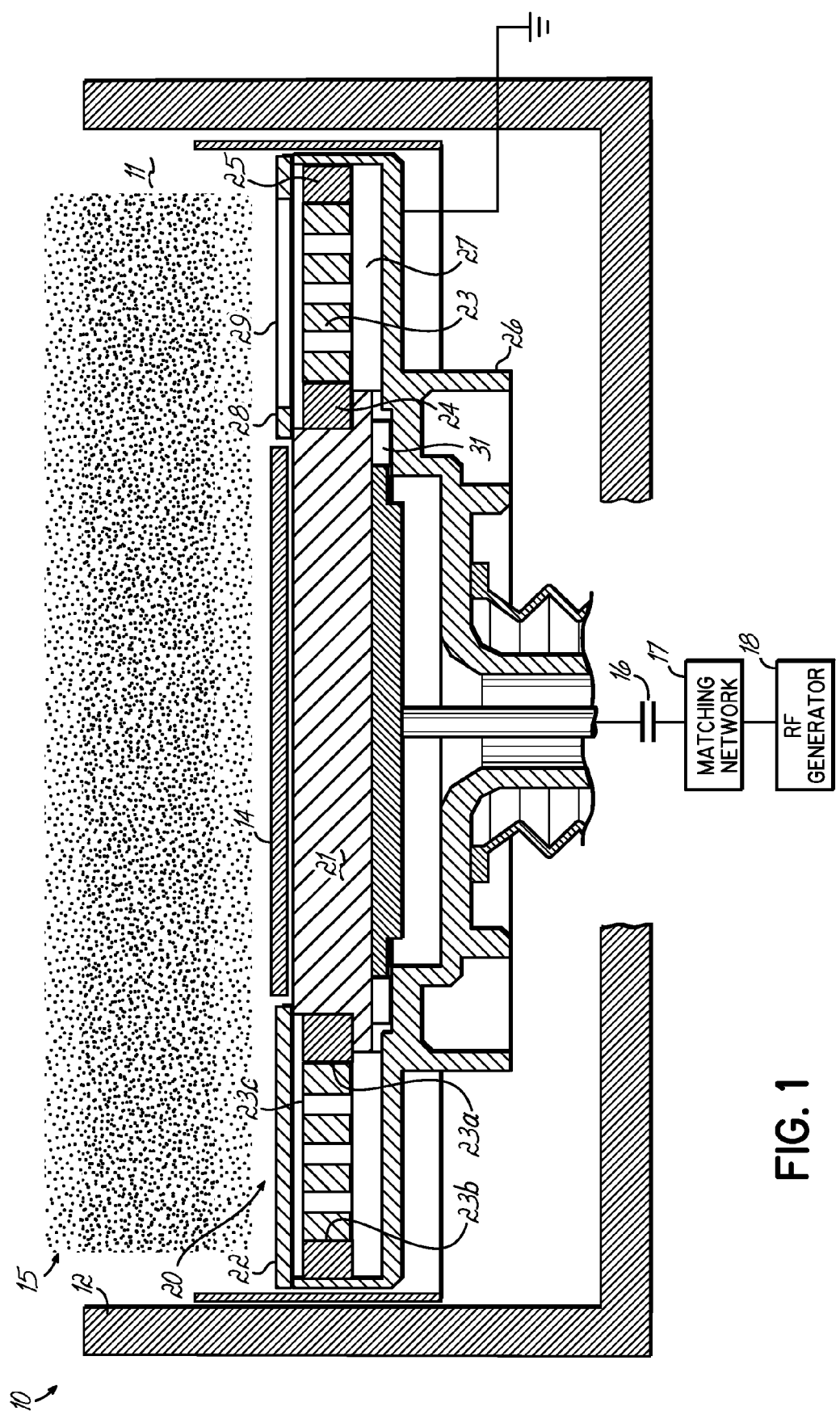
FIG. 1 is a diagrammatic cross-sectional view of a plasma processing apparatus embodying principles of the present invention.

As illustrated in FIG. 1, according to one embodiment of the invention, a plasma processing apparatus 10 includes a vacuum processing chamber 11 enclosed in a chamber wall 12. An integrated, electrostatic inductively-coupled device or wafer support (i-ESIC) 20 is mounted in the chamber 11 to support individual wafers 14 thereon for processing by a plasma 15 maintained within the vacuum chamber 11.

Figure 2:
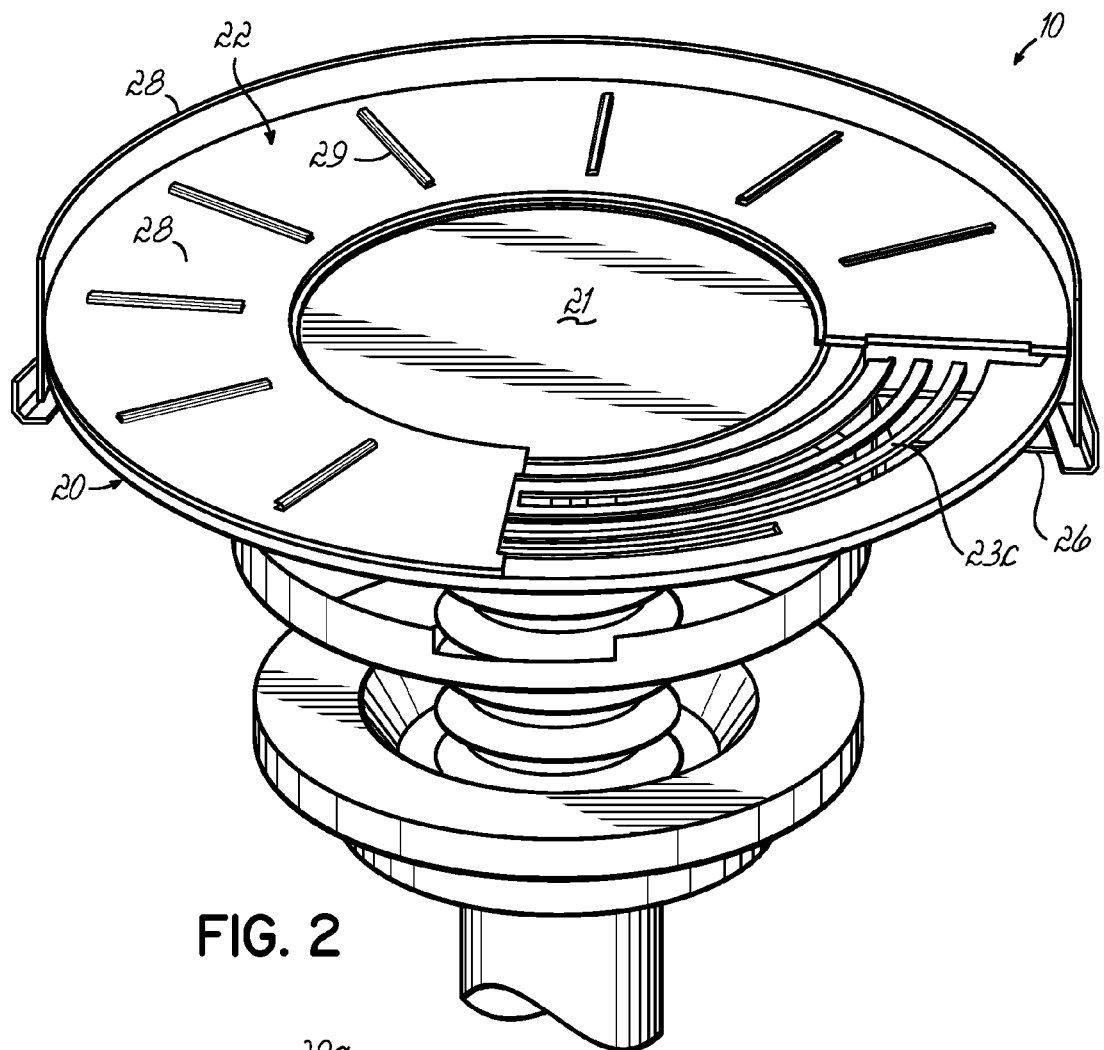
FIG. 2 is a perspective diagram, partially cut away, illustrating one embodiment of an integrated, electrostatic, inductively-coupled wafer support of the apparatus of FIG. 1, according to one embodiment of the invention.

Referring to FIGS. 1 and 2, the wafer support 20 has two integrated main components or portions: a capacitive-coupling component 21, which provides a capacitively-coupled RF path to a plasma 15, and an inductively-coupled component 22, which provides an inductively-coupled RF path to the plasma 15. The capacitively-coupled component 21 is a central substrate support portion, typically an electrostatic chuck (ESC), which holds individual wafers to the support 20 during processing. The chuck of the central portion 21 also provides control of the energy of ions from the plasma by capacitively coupling RF power to the plasma 15 and generating a voltage bias on the wafer 14 with respect to the plasma potential. The inductively-coupled component 22 is annular and surrounds the central portion 21, providing coupling to the plasma through RF magnetic fields generated by an inductive element incorporated within annular portion 22.

The i-ESIC wafer support 20 is compact and includes the central portion 21 and the perimeter portion 22. The central portion 21 of the substrate support 20 serves as a support for a wafer 14, holding and releasing wafers according to principles known in the field of ESC manufacturing and applications. The central portion 21 can contain one or both of a heating device and a cooling device (not shown) to sustain wafers 14 at process temperature, and other sensors and instrumentation (also not shown) used in such devices. Internal structure of the ESC is well known to those familiar with the field. The substrate support 20 is biased through a capacitor 16 and a matching network 17, which are connected in series between the support 20 and an RF power supply 18.

The peripheral portion 22 has an inside diameter that is larger than the diameter of the wafers 14 that are to be processed on the support 20. The peripheral portion 22 includes an annular inductive device 23 having an inner end 23a connected through an impedance 24 to the central portion 21, and an outer end 23b connected through an impedance 25 to a bottom chamber shield and support flange 26, which is grounded via the chamber walls 12. The central portion 21 is supported on, and insulated from, the support flange 26 by an insulator ring 31. The inductive device 23 has a relatively low inductance (less than 1 micro-Henry) and is schematically shown in FIG. 1 supported on the support 20 in an insulating envelope 27. The envelope 27 may be formed of $Al_2O_3$ or other suitable dielectric, which insulates the inductive device 23 from the bottom shield 26. The grounded bottom shield 26 electrically shields the device 20 to prevent plasma ignition below the support 20.

The top surface 23c of the inductive element 23 is protected from the plasma 15 by a metallic shield 28. Shield 28 serves as a Faraday shield and is made of an electrically high-conductivity material such as metal. To provide transparency to RF magnetic fields, the shield 28 contains radially or almost radially extending slots 29 that overlap the width of the inductive element 23. Generally, the slots 29 of the shield 28 are oriented in parallel or almost parallel to the flux lines of the RF magnetic field generated by the inductive element 23. The number and dimensions of the slots 29 are not critical and can vary, but a relatively low number of slots will provide operation of inductive device 23 as an ICP source in an ICP mode. To achieve good azimuthal uniformity, a minimal number of slots should be at least $N \geq \pi/(2 \arctan(d/2D))$, where d is the width of the annular inductive element 23 and D is the diameter of an annular inductive element 23. In the illustrated embodiments, N is approximately 12. Above a certain number of slots, for example 60 to 80, which might exist for inductive elements 23 having diameters of from 300 to 400 mm, the performance of the element 23 as an ICP source is not strongly affected by increasing the number of slots 29. Typical and preferable slot width is in the range of 0.5-5 mm, although the acceptable range of slot width is not limited by this interval.

Figure 2A:
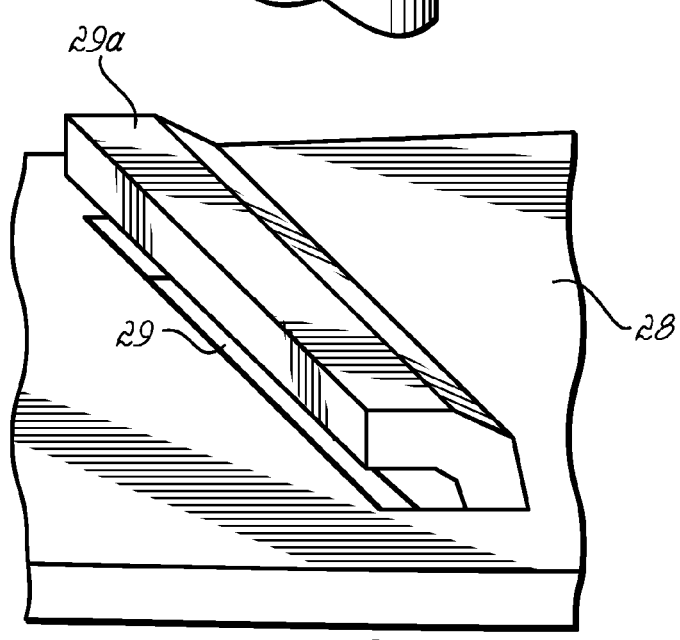
FIG. 2A is an enlarged perspective view of a portion of one embodiment of a shield of the integrated, electrostatic, inductively-coupled wafer support of FIG. 2.

The electrostatic shield 28 functions to protect the inductive element 23 from the plasma 15, (e.g. from the direct heating, erosion, sputtering of the surface, contamination or conductive deposits) and to provide effective ICP operation. One example of a preferred configuration of slots 29 for the shield 28 is shown in the FIG. 2A. Overlapping portions 29a of the slot structure eliminate direct deposition on the inductive element 23. Other slot configurations, such as slots 29 of chevron-shaped cross-section, might also be preferable.

As described and illustrated above, the wafer support 20, together with inductive device 23, is compact. The inductively-coupled member 22 of the support 20 provides increased density at the perimeter of the wafer 14, and thus compensates for radial loss of charged particles towards the walls 12 of the chamber 11, and generates plasma 15 of uniform density above the wafer 14 being processed. The i-ESIC device operates continuously in two modes: a capacitive-coupled plasma (CCP) mode in the center of the device 20 where the wafer 14 is supported, and an inductively-coupled plasma (ICP) mode at the perimeter of the wafer 14, both modes being powered utilizing a common matching network 17 and RF generator 18.

Figure 1A:
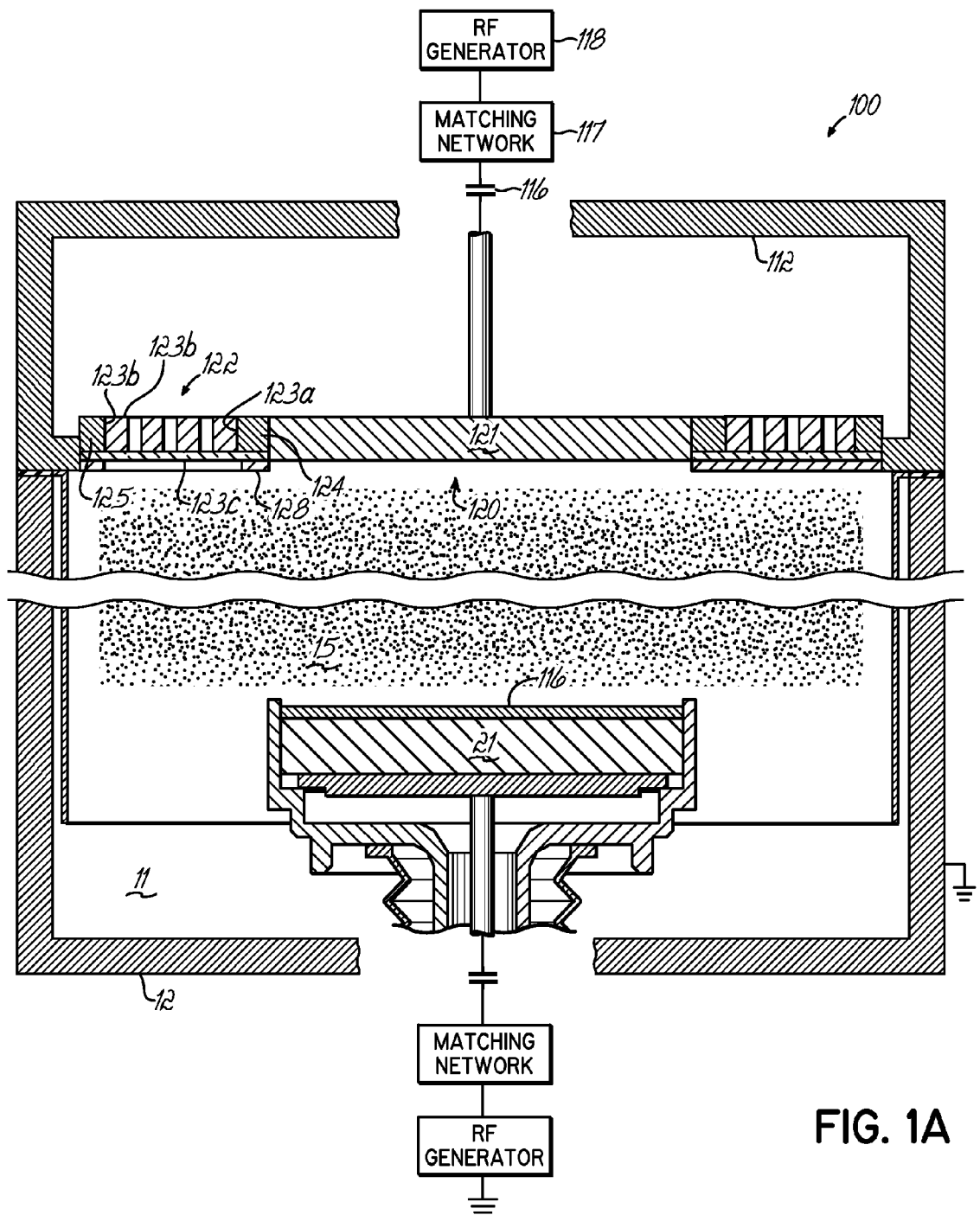
FIG. 1A is a diagrammatic cross-sectional view, similar to FIG. 1, of an alternative embodiment of a plasma processing apparatus according to principles of the present invention.

FIG. 1A illustrates an alternative embodiment 100 of the plasma processing apparatus 10 that is more adaptable to etch systems. The apparatus 100 may include vacuum processing chamber 11 enclosed in chamber wall 12. The integrated, electrostatic inductively-coupled device (i-ESIC) 20 of FIG. 1 may be mounted in the chamber 11 to support individual wafers 14 for processing, or a wafer holder may be provided that only includes the capacitive-coupling wafer support component 21 on which is supported the wafer 14, but includes no IC component 22.

In the embodiment 100 of FIG. 1A, an integrated device 120 is provided facing the wafer support 21, which includes a central electrode 121 that provides a capacitively-coupled RF path to a plasma 15. The device 120 also includes an inductively-coupled component 122 that provides an inductively-coupled RF path to the plasma 15. The capacitively-coupled component 121 is a central electrode portion for energizing the plasma 15 for etching a wafer 14 on the support 21. The central portion 21 of the electrode provides control of the energy of ions from the plasma by capacitively coupling RF power to the plasma 15 and generating a voltage bias of the plasma with respect to the wafer 14 on the support 21. The inductively-coupled component 122 is annular and surrounds the central electrode portion 121, providing coupling to the plasma through RF magnetic fields generated by an inductive element incorporated within annular portion 122.

The integrated device 120, with or without an i-ESIC wafer support 20, including the central electrode 121 and the perimeter portion 122, is compact. The central electrode 121 of the device 120 is biased through a capacitor 116 and a matching network 117, which are connected in series between the electrode 20 and an RF power supply 118.

The peripheral portion 122 has an inside diameter that can be larger than the diameter of the wafers 14 being processed. The peripheral portion 122 includes an annular inductive device 123 having an inner end 123a connected through an impedance 124 to the central portion 121, and an outer end 123b connected through an impedance 125 to the grounded chamber walls 12 or the grounded chamber lid 112. The electrode 121 is supported by the integrated device 120 on the chamber lid 112, but is insulated from the lid 112 and the chamber wall 12. The inductive device 123 has a relatively low inductance (less than 1 micro-Henry).

A dielectric window 123c may be provided at the bottom side of the inductive device 123, allowing the inductive device 123 to be located outside of the vacuum chamber 12. The bottom of the inductive device 123 or of the dielectric window 123c may be protected from the plasma 15 by a metallic shield 128 that is similar to the shield 28, described above, and serves as a Faraday shield. This shield 128 may be made of an electrically high-conductivity material such as metal, and can be made transparent to RF magnetic fields by providing radially, or almost radially, extending slots.

The electrostatic shield 128, where used, would function to protect the inductive element 123 or window 123c from the plasma 15 and to provide effective inductive coupling of energy from the inductive element 123 into the chamber 11. Like the wafer support 20 described above, the integrated device 120, with the CCP electrode 121 together with inductive device 123 of the peripheral portion 122 is a compact device that provides increased plasma density at the perimeter of the wafer 14, which can compensate or radial loss of charged particles towards the walls 12 of the chamber 11, providing plasma 15 of uniform density in the vicinity if the wafer 14 is being processed. The integrated device 120 operates in a combined capacitive-coupled plasma (CCP) mode at its center and an inductively-coupled plasma (ICP) mode above the perimeter of the wafer 14, both modes being powered utilizing a common matching network 117 and RF generator 118.

Figure 3:
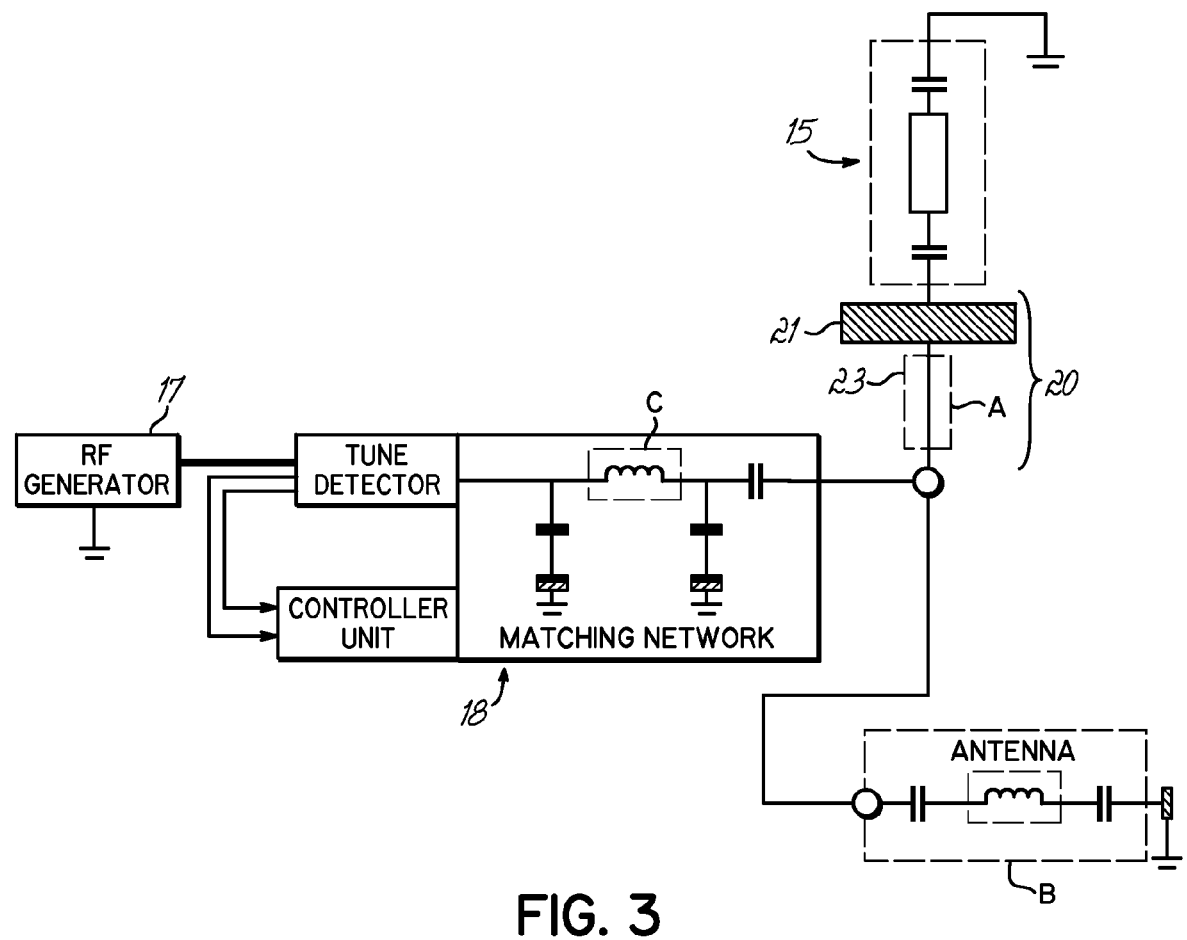
FIG. 3 is an circuit diagram of an integrated CCP and ICP device of the plasma processing apparatus embodiments of FIGS. 1 and 1A.
Figure 3A:
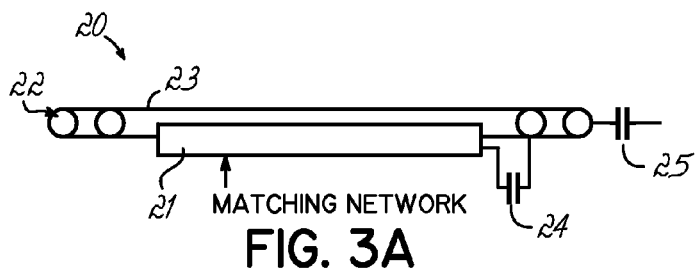
FIGS. 3A-3F are cross-sectional diagrams of six exemplary coils that can be used for the inductively-coupled element of the wafer supports of FIGS. 1 and 2.
Figure 3B:
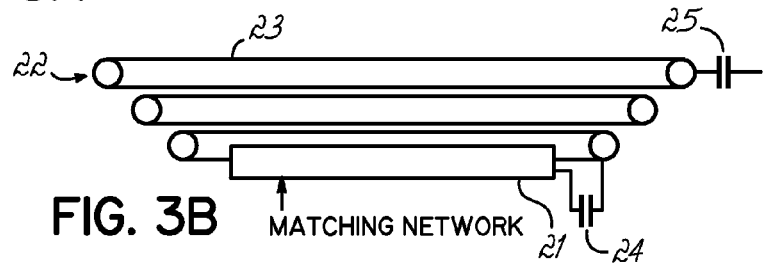
Figure 3C:
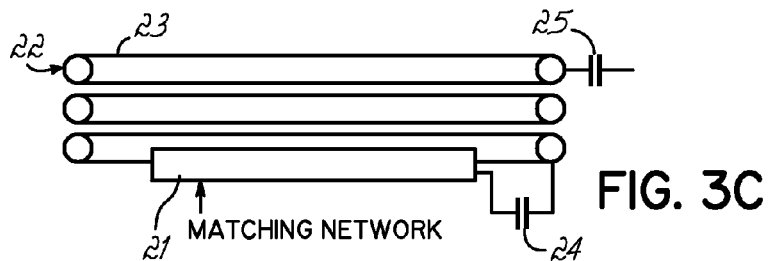
Figure 3D:
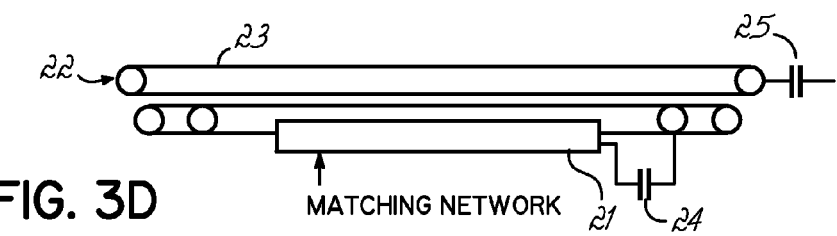
Figure 3E:
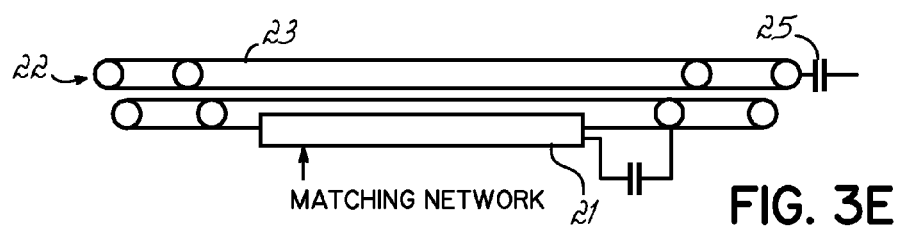
Figure 3F:
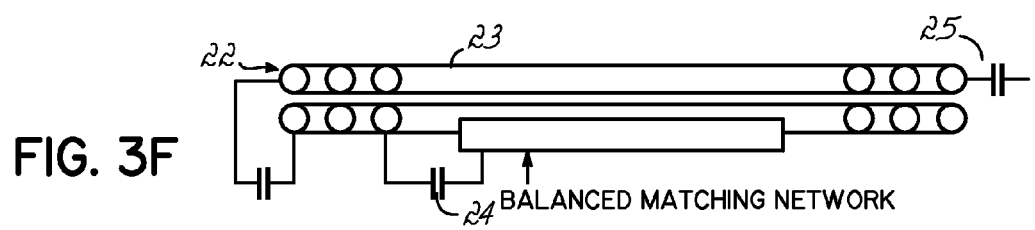
Figure 4A:
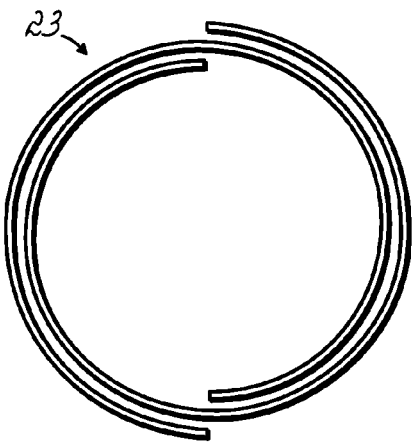
FIGS. 4A-4B are top and perspective diagrams, respectively, of one embodiment of a bifilar coil similar to that of FIG. 3F.
Figure 4B:
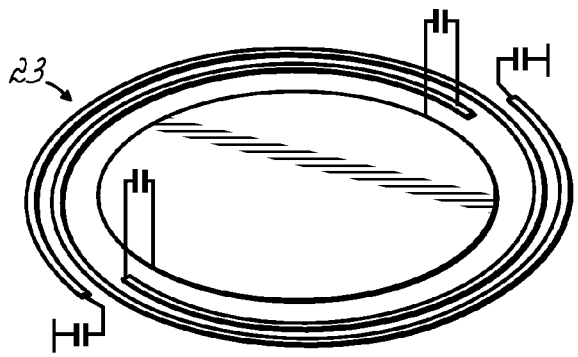
Figure 4C:
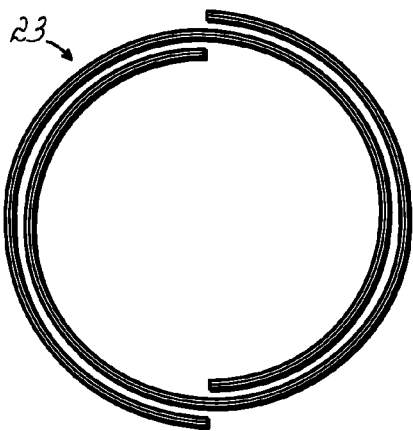
FIGS. 4C-4D are top and perspective diagrams, respectively, similar to FIGS. 4A-4B, of another embodiment of a bifilar coil.
Figure 4D:
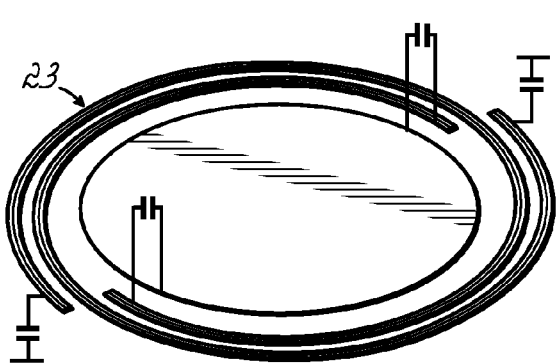

The central portion 21 of the wafer support 20 and the central electrode 121 of the upper electrode device 120 are similarly connected in circuits with the respective RF generators 118 and 118 through the respective corresponding matching networks 18 and 118. For example, FIG. 3 illustrates an equivalent circuit for integrated device 20 in which generator 17 is connected through matching network 18 to the wafer support electrode 21, which is coupled through the plasma 15 to ground. The annular inductive portion 23 can be incorporated into this circuit in a number of ways such that the entire circuit can be brought into resonance. The inductive portion 23 can be incorporated in series with the support electrode 21 into the circuit at the designated location A in FIG. 3, or in parallel with the electrode 21 at the designated location B in FIG. 3. Alternatively, the inductive portion 23 can be made part of the inductor of the matching element, shown at location C in FIG. 3.

The ICP portions 22 and 122 can each be represented by an equivalent circuit shown in the B box in FIG. 3. The inductor 23 or 123 is shown as the inductance labeled $L_{ANTENNA}$, shown connected in series between in and out impedances 24 or 124 and 25 and 125, represented by capacitive impedances $C_{IN}$ and $C_{OUT}$, respectively. This equivalent circuit can be represented as an inductance connected in series with only one such impedance. $C_{IN}$ and $C_{OUT}$ may be either fixed or variable impedances. Resistive components of an equivalent circuit can be considered as coupled to both the ICP and CCP electrodes to represent the plasma power consumption.

Typically a Π-matching network of the type shown in FIG. 3 is employed to match generator and source impedance. The matching network 18 is connected between the generator 17 and an equivalent circuit of wafer support 21 and capacitive coupled plasma 15. The antenna of the inductive portion 23 can be connected in any of the three configurations A, B or C in a resonant circuit with the CCP plasma and electrode 21. Similarly, the matching network 118 is connected between the generator 117 and an equivalent circuit of electrode 121 and capacitive coupled plasma 15. The antenna of the inductive portion 123 can also be connected in any of the three configurations A, B or C in a resonant circuit with the CCP plasma and electrode 121.

Generally, three elements arranged in a T- or Π-network configuration can be used to match any discharge and inductive element impedances at a given frequency. Another applicable matching network for an inductive discharge element can be formed in an L-design using two variable capacitors.

The design and construction of the matching circuits are well known to a person skilled in the art. In general RF matching units 18 and 118 can include several variable reactive elements, inductors or capacitors, by which the impedance of the RE match section can be adjusted to achieve a match between the RF generators 17 and 117 and RF driven electrode 21 and 121 and the coil of elements 23 and 123 to thereby maximize the RF power that is delivered to the plasma 15 within the chamber 11. A combination of the series and parallel elements can result in the desired impedance match of the source inductor to the driving generator for maximum current.

The operation and details of the device 20 and the operation and details of the device 120 are similar, and can be described in relation to the i-ESIC device 20, in which the chamber 11 pumped to a base vacuum pressure and filled with processing gas at low pressure, typically, but not necessarily, in the range of from several mTorr to 100 mTorr. With no plasma inside the chamber, RF power from the RF generator 18 through matching network 17 and capacitor 16 is delivered to the substrate holder 20. Before plasma is ignited, RF current cannot flow through the high impedance low-pressure gas. The substrate holder 20 is connected to an inductive element 23 in series with the impedances 24 and 25 and eventually, including stray capacitance, to ground, produces a serial resonant circuit that includes the capacitor 16 at the output of the matching network 17. Resonant frequency of such serial resonant circuit f is given by $f=1/(2\pi\sqrt{LC})$, where the capacitance C in series with the inductive element 23 includes all of the capacitances of the circuit.

The inductive element 23 itself, due to stray (mutual) capacitances, represents a serial-parallel resonant circuit. Portions of the parallel capacitive component of the parallel resonant circuit of the inductive element are formed from the distributed inter-winding capacitances of the inductive element 23, while other stray capacitance is from the element 23 to ground. A rough estimate for a typical single helical or spiral coil (3-4 turns, diameter from 100 to 400 mm) of a type used in plasma processing gives a resonant frequency approximately in range from about 1 MHz to 100 MHz.

Under vacuum conditions, in the serial circuit loop the resistance is very small (e.g. the Q-factor of such resonant circuit is very high). At resonant conditions the impedance of inductive element 23 is high so an induced voltage at the inductive element will be high. Because the antenna end connected to substrate holder through impedance 24 is at a higher potential than the end connected to the ground through impedance 25, an intense electric field will ignite the plasma 15 within low pressure processing zone of the chamber 11. Generally, the matching network 17 does not need to match absolutely into the parallel resonance frequency, because the inner end of the inductive element that is connected through impedance 24 to central portion 21 of the wafer holder 20 can strike plasma by capacitive coupling more easily than the inductively-coupled component 22. Relatively low power (<100 Watts) is sufficient to ignite plasma by capacitive coupling.

Once the plasma 15 is ignited, it spreads into the volume of the chamber 11 above the inductive element 22, where an intense electric field induced by the RF magnetic field will deliver additional RF power into the plasma 15. The load that the inductive element 23 now sees is much larger. The inductive element 23 is thereby coupled to a resistive plasma 15. Increased resistive load in series in loop with inductive element 23 lowers the Q-factor of resonant circuit, which reduces the voltage of the inductive element 23. Matching to the new resonance frequency increases the current through inductive element 23.

Because the substrate holder 20 is exposed now to the plasma 15, RF current flows through the wafer 14 and a capacitive sheath into the plasma 15, creating a parallel loop to the inductive element loop. This creates a parallel resonant circuit with capacitance given by the ESC 21, wafer 14 and sheath capacitances.

At constant plasma parameters, e.g. when process parameters are optimized for unique process conditions, the choices among the inductive element inductance and the various capacitances may provide resonance at the same excitation frequency as the RF supply 18. Then there would be no need for tuneable matching network. However, a high impedance RF power supply should be used in such case or at least a load capacitor should be used to set the impedance of the mismatched line due to varying coil impedance at vacuum and plasma conditions, and to reduce any mismatch due to varying plasma parameters.

The inner impedance 24 may be omitted; however, at very low pressure it eliminates self-DC bias of the inductive element 23 by potential from the ESC 21, thus eliminating arcing. Similarly, the outer impedance 25 may be omitted; however, it provides a more convenient distribution of the RF potential on the inductive element 23 to reduce arcing probability.

In some special cases, for example, bifilar antenna configurations, the value of the stray capacitance of the inductor 23 can be designed into the inductive element 23, as can the capacitances in and out of the inductor through impedances 24 and 25, either one or both of which can be replaced by such stray capacitance or otherwise integrated into the device in the form of dielectric coatings deposited between the capacitive substrate holder portion 21 and the inductive element 23 of the peripheral inductive portion 22. The thickness of these coatings and cross-sectional areas of the metallic parts at the end connections define the values of the various capacitances. Typically, the surface of the electrostatic chuck is coated by sprayed Alumina. Other dielectric materials or their combinations may be used.

Overall, several relations, which are practical and may be used as the design rules in the development of the I-ESIC device. The inductance $L_{ANTENNA}$ and parallel capacitance $C_{PARALLEL}$ of the inductive element 23 should be within range $C_{PARALLEL} \cong \beta(1/\omega^2 L_{ANTENNA})$, $0<\beta<1$. The effective inductive impedance of the inductive element is then estimated by inductance $L_{EFFECTIVE\ ANTENNA} \cong L_{ANTENNA}/(1-\beta)$, $0<\beta<1$. The relation of the capacitance in series with inductive element 23 is $C_{PARALLEL} \cong (1-\beta)/(\gamma\omega^2 L_{ANTENNA})$, $0<\beta<1$, $0<\gamma<1$. Accordingly, the effective impedance of the ICP branch, $L_{EFFECTIVE\ ICP}$, (the inductively-coupled portion 22 of the support 20), is within the range $L_{EFFECTIVE\ ICP} \cong L_{ANTENNA}(1-\gamma)/(1-\beta)$, $0<\beta<1$, $0<\gamma<1$, and the impedance of the CCP branch, $C_{CCP}$ (the capacitively-coupled portion 21 of the support 20) is within the range $C_{CCP} \cong (1-\beta)/((1-\gamma)\omega_2 L_{ANTENNA})$, $0<\beta<1$, $0<\gamma<1$.

In accordance with another embodiment of the invention, the RF signal from the matching unit 17 may be supplied to the outer end of the inductive element 23 through the impedance 25, and the inductance 23 connected through impedance 24 to the substrate holder 21. In this case when igniting plasma, instead of a parallel resonant circuit, the serial resonant circuit will remain. However, the resonant frequency will change due to the change in serial capacitance to the inductive element 23.

Still another embodiment disclosed in this invention integrates the inductive element 23 within the matching network 17, with the inductive element 23 and impedances 24 and 25 replacing the coil of the matching network between the connection points of adjustable load and tuning capacitors connected to ground (not shown). This makes a very compact integrated ESIC.

The design and construction of the matching circuits 17 are well known to persons skilled in the art. In general, an RF matching unit 17 includes several variable reactive elements (inductors or capacitors) by which the impedance of the RF matching section can be adjusted to achieve a match between RF cable (or nominal RF generator output) and an RF driven electrode or coil to thereby maximize the RF power that is delivered to the plasma 15 within the chamber 11. A combination of the series and parallel elements can result in the desired impedance match of the source inductor to the driving generator for maximum current. Generally, three elements can be used to match any discharge and inductive element impedances.

The inductive element 23 may have single or multiple turns that can be connected in parallel or in series. Several examples are shown in FIGS. 3A-3F, but disclosure is not limited by these only. In each of these figures, the wafer support 20 is shown made up of the capacitively-coupled component or ESC 21 and the inductively-coupled component 22 coupled together in series resonant circuit. The inductively-coupled component 22 is, in turn, made up of the inductive element 23 coupled in the series circuit between the impedances, typically capacitances, 24 and 25. Each figure slows the matching network output connected to the ESC 21. The inductive element 23 is a planar two-tun concentric coil in FIG. 3A, a conical concentric coil in FIG. 3B, a cylindrical or helical coil in FIG. 3C, combined concentric coils in FIG. 3D, a two-planar concentric coil in FIG. 3E, and a bifilar concentric coil in FIG. 3F.

One practical coil and well suited use as an inductive element 23 is the so-called bifilar configuration that can be utilized as a self-balanced inductive element due to the interwinding stray capacitance, as shown in FIGS. 4A-4D. Geometry of the bifilar inductive element for the inductive element 23 eliminates substantially the need for the connecting impedances 24 and 25 due to inter-winding capacitance of the individual coils. Multiple segments each constituting full 360 degree loops are illustrated in FIGS. 4A-4D. Partial (less-than-360 degree) loops, more-than-360 degree loops, and one or more than one loop may be employed for the inductive element 23. The cross-section of the conductor of the inductive element 23 may be rectangular or circular or any other cross-section with typical overall diameter in range from 2 mm to 10 mm.

Figure 5A:
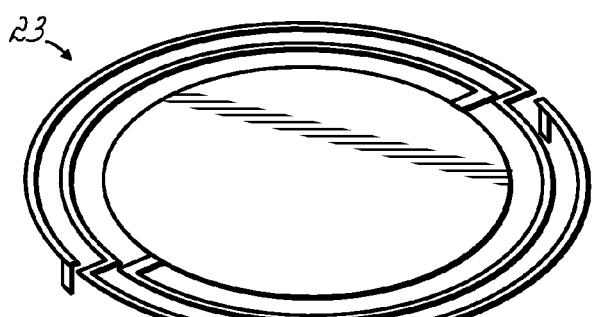
FIGS. 5A-5C are perspective diagrams of one embodiment of an inductive element, a graph of time-averaged RF electromagnetic energy for such element, and a graph of power density delivered into the plasma by such element.
Figure 5B:
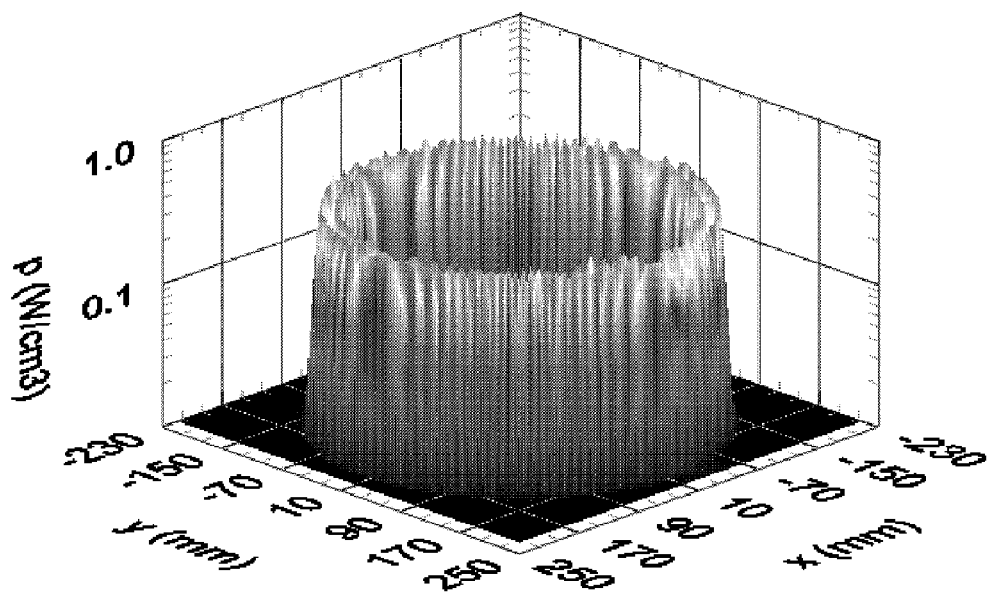
Figure 5C:
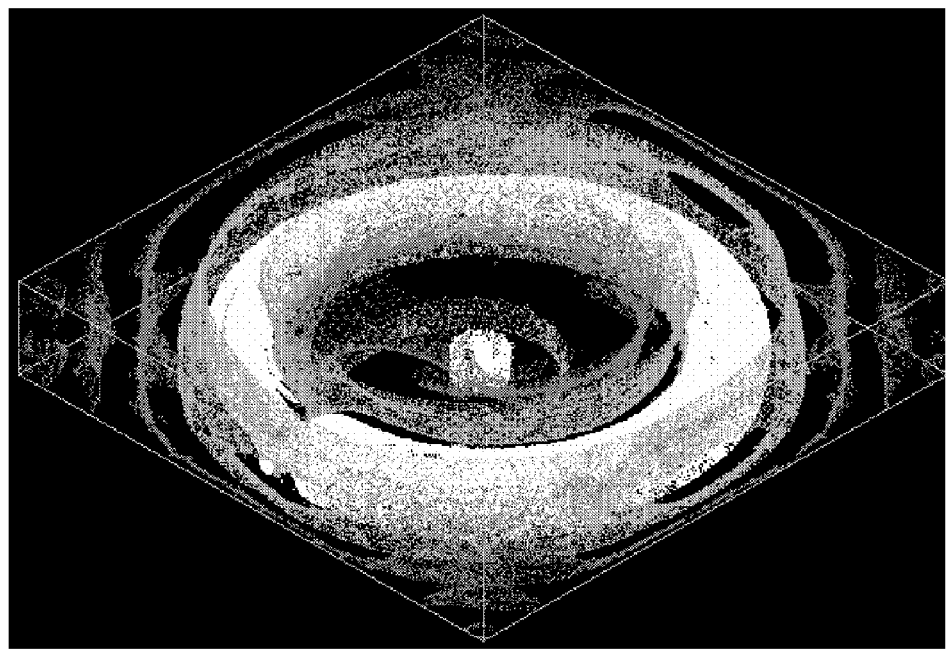

The inductive element 23 of the support 20 illustrated in FIG. 2 is an embodiment of a compact integrated device 20 with the inductive element 23 in a form of a single three turn coil integrated into the base-plate of the ESC or central portion 21. FIG. 5A illustrates an inductive element 23 made of two superimposed single turn coils. FIG. 5C is a simulation of time-averaged RF electromagnetic energy and FIG. 5B is a graph of RF power density delivered into the plasma 15, both in the absence of a Faraday shield 28. The annular distribution is typical for the i-ESICs described herein.

Figure 6A:
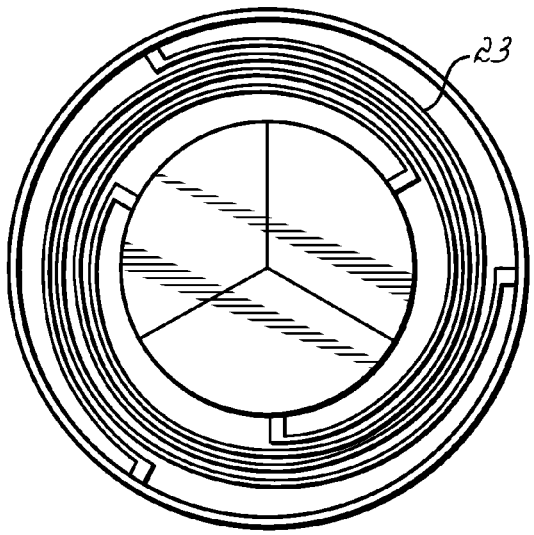
FIGS. 6A-6B are top and perspective diagrams, respectively, of another embodiment of an inductive element for the wafer support of FIGS. 1 and 2.
Figure 6B:
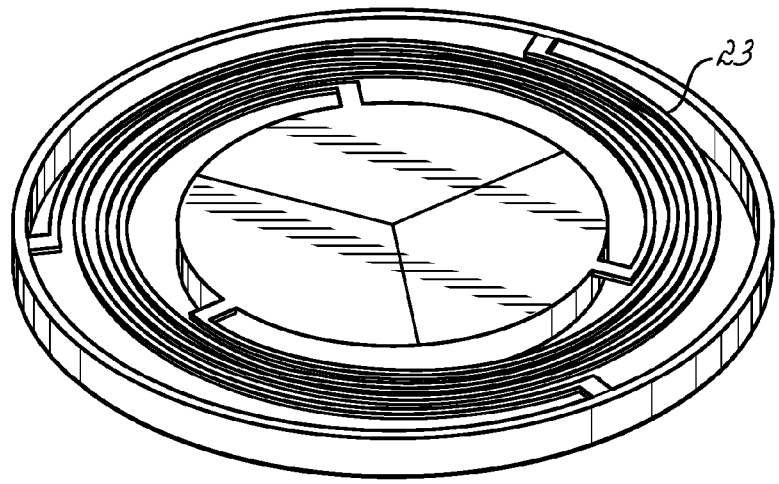
Figure 6D:
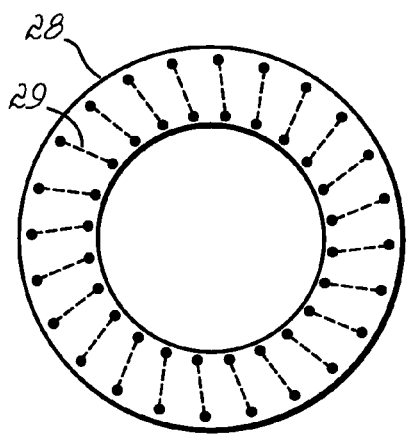
FIG. 6D, is a slot pattern diagram for a Faraday shield for use with the element of FIGS. 6A and 6B.
Figure 6C:
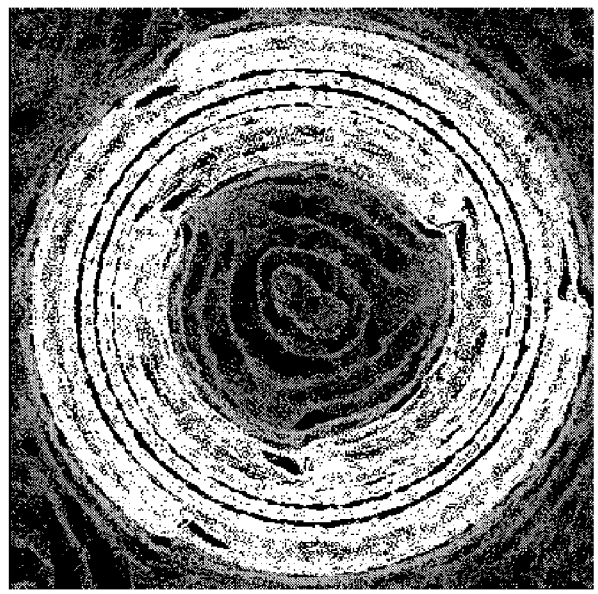
FIG. 6C is a graph of time-averaged RF electromagnetic energy for the element of FIGS. 6A and 6B.
Figure 6E:
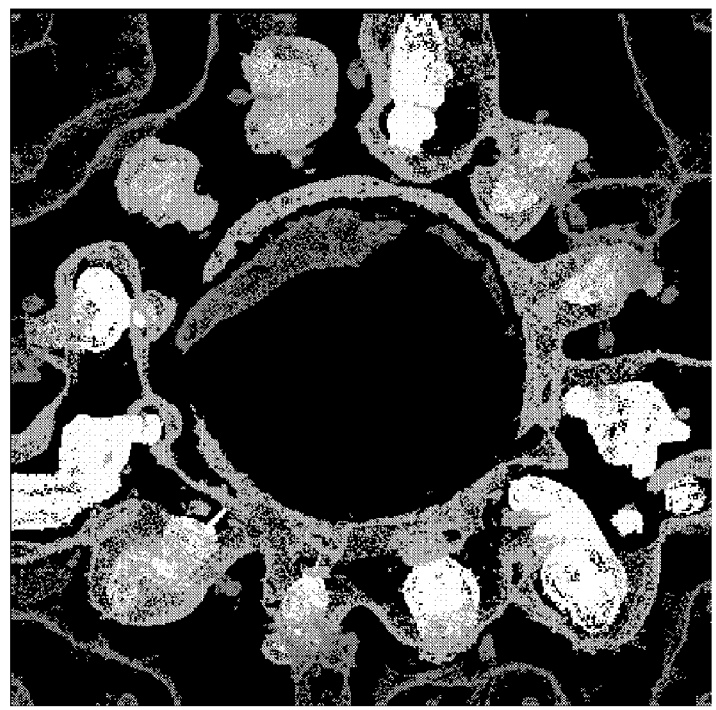
FIG. 6E is a graph of time-averaged RF electromagnetic energy for the element of FIGS. 6A and 6B equipped with a Faraday shield having the slot pattern of FIG. 6D.

FIG. 6A-6B show an inductive element 23 made of three single-turn coils, with the impedances 24 and 25 omitted for convenience. FIG. 6C is a graph of simulation results of the distribution of time-averaged RF electromagnetic energy from and RF power density delivered into plasma 15. FIG. 6D is a diagram of a Faraday shield 28 with radial slots 29. A graph of the distribution of the RF power density through the shield of FIG. 6D is illustrated in FIG. 6E.

Figure 7:
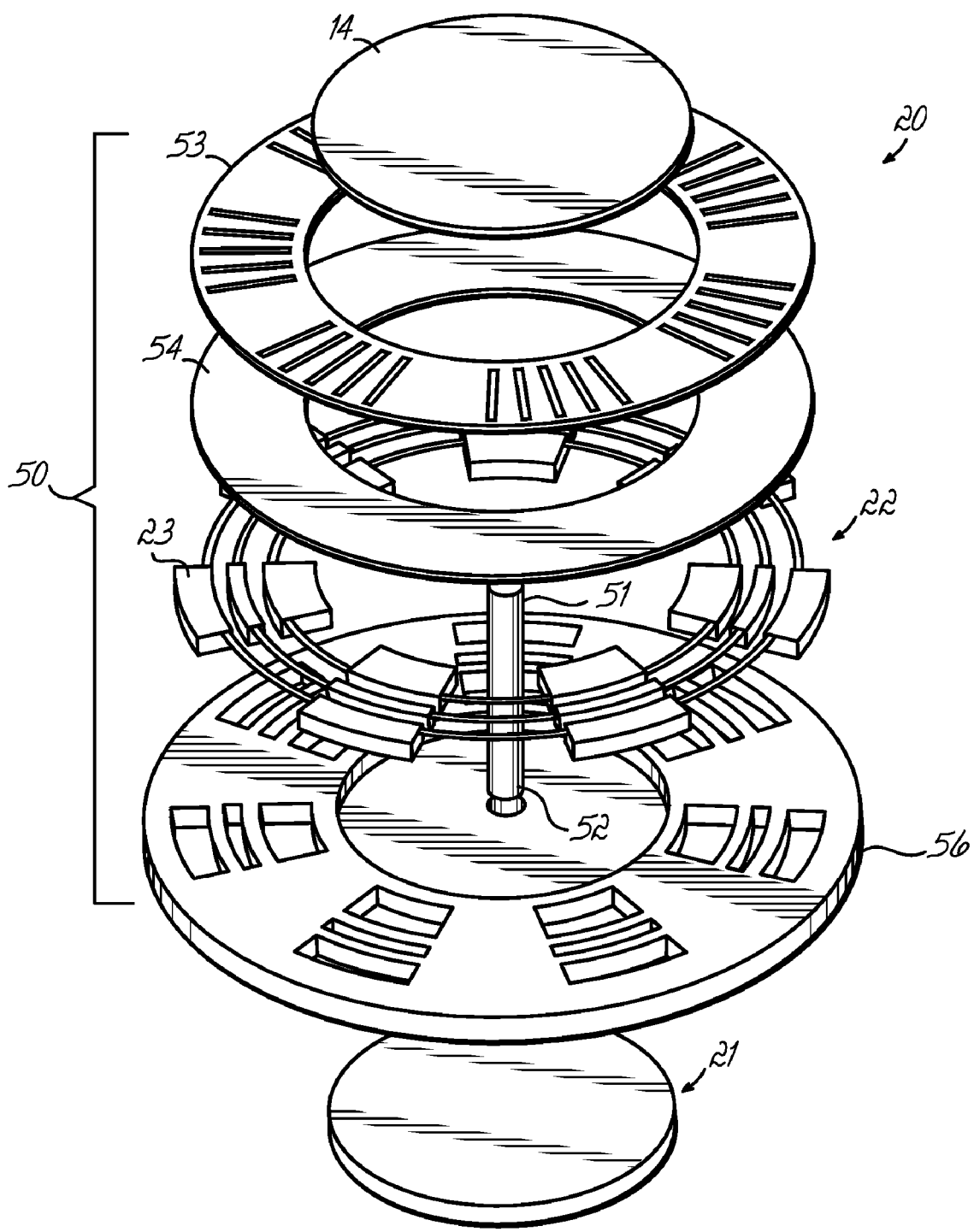
FIG. 7 is a disassembled perspective view of an alternative embodiment of the wafer support of FIGS. 1 and 2 that employs a segmented peripheral source for the inductive element.

FIG. 7 is a disassembled perspective view of an alternative embodiment of the wafer support of FIGS. 1 and 2 that employs a segmented peripheral source 50 for providing the inductive element 23. Segmented peripheral ICP sources are more particularly described in copending U.S. patent application Ser. No. 10/717,268, filed Nov. 19, 2003, by the inventor hereof, and hereby expressly incorporated by reference herein in its entirety. The source 50 includes a segmented antenna which forms the inductive element 23, which is mounted in a congruent insulating plate 56 that separates the inductive device 23 from the chamber wall 12 and other conductive components of the chamber 11. The element 23 has terminals 51,52 that may respectively connect the inductor 23 in series between the impedances 24 and 25 (not shown in FIG. 7) and the ESC 21. An annular, segmented, slotted Faraday shield 53 is provided to serve as the shield 28 over the inductor 23. An insulator 54 may be provided between the shield 53 and the inductor 23. Otherwise, the inductor 23 of the source 50 may be connected in the various ways set forth above for the other inductor configurations. The embodiment of FIG. 7 combines the features of the integrated, electrostatic, inductively-coupled wafer support (i-ESIC) 20 and the segmented peripheral ionization source of the incorporated patent application.

The operation and details of the integrated element 20, in an i-ESIC wafer support, can be applied to integrated element 120 in an etch system upper electrode. Either or both in combination contribute to the generation of a ring-shaped peripheral IC plasma distribution that combines with the central CCP to improve plasma uniformity at the wafer.

With the integrated devices 20 and 120, significant improvement can be expected when used in ballistic electron-beam enhanced plasma etchers, where VHF radial and axial E-fields produce a spatially dependent plasma density due to the creation of standing waves in the space between the planar electrodes 121 and 21, for example. Inductively coupled plasma provided by the integrated devices 20 and 120 will reduce plasma potential by reducing E-fields in such systems and thereby compensate for the standing wave profiles. Effectively higher IC plasma density generation can be created even at relatively low RF powers, for example, several hundreds of Watts.

The CCP electrode(s) 21 and 121, when integrated with the inductive devices 23, 123, respectively, create a compact RF VHF device. The inductively coupled element 23, 123 provide increased density at the perimeters of the wafer electrode 21 and the top VHF electrode 121, thus compensating for the radial loss of charged particles towards the walls of the chamber, thereby generating uniform plasma density in the immediate vicinity of the surface of the wafer being processed. An annular slotted shield protects inductive element structure from the plasma and provides the conditions for effective inductive coupling of an RF power into plasma. The i-ESIC device operates continuously in both the CCP mode and the ICP mode utilizing a common matching network and RF generator. The CCP mode contributes to plasma that peaks in the center of the chamber while the TCP mode contributes to plasma in a ring shape that is distributed annularly at the perimeter of the chamber around the outer edge of the wafer.

The invention has been described in the context of exemplary embodiments. Those skilled in the art will appreciate that additions, deletions and modifications to the features described herein may be made without departing from the principles of the present invention. Accordingly, the following is claimed:

The invention claimed is:

1. An ICP source for a semiconductor wafer plasma etching apparatus comprising:
   a substrate support electrode;
   a capacitively coupled plasma (CCP) electrode parallel to and spaced apart from the substrate support electrode; a first RF generator and first matching network connected in series with the substrate support electrode, wherein the first RF generator is connected to the substrate support through the first matching network;
   a series RF circuit that includes a peripheral ionization source comprising a planar inductive coil, coupled by a capacitor in series with and surrounding the CCP electrode on the periphery thereof, the CCP electrode and the peripheral ionization source forming a common plane having the CCP electrode at its center;
   a second RF generator and second matching network connected in series with the CCP electrode, the second RF generator being directly connected to the CCP electrode through the second matching network, said RF generator coupling RF energy to the series RF circuit to bias the CCP electrode to capacitively couple energy to a plasma proximate the plane and to energize the peripheral ionization source to inductively couple energy to the plasma proximate and parallel to the plane, to thereby form a high density plasma across the substrate support electrode by both capacitively and inductively coupling energy thereto from the series RF circuit; and
   a slotted Faraday shield between the planar inductive coil and the plasma for facilitating the inductive coupling of energy from the inductive coil into the plasma and for impeding the capacitive coupling of energy from the inductive coil to the plasma.

2. The ICP source of claim 1 wherein:
   the first RF generator and the second RF generator have different operating frequencies, the frequency of the second RF generator being higher than the frequency of the first RF generator.

3. The ICP source of claim 1 wherein the peripheral ionization source
   generates an RF magnetic field into the plasma.

4. The ICP source of claim 1 wherein:
   the planar inductive coil is an annular inductive element that surrounds the CCP electrode.

5. The ICP source of claim 1 wherein:
   the peripheral ionization source includes an annular antenna that surrounds the CCP electrode and is capacitively-coupled in series with the CCP electrode to form the RF series circuit.

6. The ICP source of claim 1 wherein:
   the second matching network is connected to an output of the second RF generator and the peripheral ionization source is capacitively connected at one end thereof to said second matching network and is capacitively-coupled at an opposite end thereof to the CCP electrode.

7. The ICP source of claim 1 wherein:
   the peripheral ionization source is capacitively-coupled at one end thereof to the CCP electrode and is capacitively-coupled at the other end thereof to the chamber ground.

8. The ICP source of claim 1 wherein:
   the peripheral ionization source is capacitively-coupled to the CCP electrode;
   and the second matching network has impedances in series with the peripheral ionization source that are approximately tuned to the frequency of the RF generator.

9. The ICP source of claim 1 wherein:
   the peripheral ionization source is configured to inductively couple RF energy into the plasma to form a high density ring-shaped plasma concentrated toward the perimeter of the substrate support surface.

10. The source of claim 1 wherein:
    the substrate support includes a wafer supporting surface formed of the substrate support electrode.

11. The source of claim 1 wherein:
    the substrate support includes a wafer supporting surface adapted to support a wafer held on the substrate support; and
    the CCP electrode is spaced apart from and parallel to the wafer support surface such that a wafer, when held on the substrate support, lies between and parallel to the CCP electrode and the wafer support surface.

12. An ICP source for a semiconductor wafer plasma etching apparatus comprising:
    a substrate support electrode;
    a capacitively coupled plasma (CCP) electrode parallel to and spaced apart from the substrate support electrode;
    a first RF generator and first matching network, the first RF generator being connected in series with the substrate support electrode through the first matching network;
    a second RF generator and second matching network, the second RF generator being connected in series with the CCP electrode through the second matching network;
    a first series RF circuit that includes a first peripheral ionization source comprising a planar inductive coil coupled directly by a capacitor in series with and surrounding the substrate support electrode on the periphery thereof, the substrate support electrode and the peripheral ionization source forming a common plane having the substrate support electrode at its center;
    a second series RF circuit that includes a second peripheral ionization source comprising a planar inductive coil connected directly by a capacitor with and surrounding the CCP electrode on the periphery thereof, the second RF generator being connected to the series RF circuit through the second matching network; the CCP electrode and the peripheral ionization source forming a common plane having the CCP electrode at its center; and
    the RF generators coupling RF energy to the series RF circuits to bias the electrode included therein to capacitively couple energy to a plasma proximate the plane and to energize the peripheral ionization source to inductively couple energy to the plasma proximate and parallel to the plane, to thereby form a high density plasma across the surface of the substrate support electrode by both capacitively and inductively coupling energy thereto from the series RF circuit.

* * * * *

UNITED STATES PATENT AND TRADEMARK OFFICE
CERTIFICATE OF CORRECTION

| | | |
|---|---|---|
| PATENT NO. | : 7,771,562 B2 | |
| APPLICATION NO. | : 11/563399 | |
| DATED | : August 10, 2010 | |
| INVENTOR(S) | : Jozef Brcka | |

It is certified that error appears in the above-identified patent and that said Letters Patent is hereby corrected as shown below:

Column 3

Line 38, "complimentary" should be --complementary--.

Line 49, "RE energy" should be --RF energy--.

Column 6

Line 62, "(2 arctan (d/2D)" should be --(2 arctan (d/2D))--.

Column 8

Line 22, "or radial loss" should be --for radial loss--.

Column 9

Line 25, insert the word --is-- before the word "pumped".

Column 10

Line 50, delete ", which".

Line 64, in the equation, " $\omega_2$ " should be -- $\omega^2$ --.

Column 11

Line 40, "two-tun" should be --two-turn--.

Signed and Sealed this
Eighth Day of March, 2011

David J. Kappos
*Director of the United States Patent and Trademark Office*

Column 12

Line 3, "FIG. 6A-6B" should be --FIGS. 6A-6B--.

Line 67, "TCP" should be --ICP--.

UNITED STATES PATENT AND TRADEMARK OFFICE
CERTIFICATE OF CORRECTION

| | | |
|---|---|---|
| PATENT NO. | : 7,771,562 B2 | |
| APPLICATION NO. | : 11/563399 | |
| DATED | : August 10, 2010 | |
| INVENTOR(S) | : Jozef Brcka | |

It is certified that error appears in the above-identified patent and that said Letters Patent is hereby corrected as shown below:

Col. 2, line 55, "TCP" should read --ICP--.

Signed and Sealed this
Nineteenth Day of April, 2011

David J. Kappos
*Director of the United States Patent and Trademark Office*